United States Patent
Uziel et al.

(10) Patent No.: US 6,566,169 B1
(45) Date of Patent: May 20, 2003

(54) METHOD AND APPARATUS FOR LOCAL VECTORIAL PARTICLE CLEANING

(75) Inventors: Yoram Uziel, Yodfat (IL); Natalie Levinsohn, Hadera (IL); David Yogev, Haifa (IL); Yehuda Elisha, Kfar Vradim (IL); Yitzhak Ofer, Kiryat Tivon (IL); Lev Fris Man, Zichron Yaakov (IL); Jonathan Baron, Haifa (IL)

(73) Assignee: Oramir Semiconductor Equipment Ltd., Yokneam (IL)

( * ) Notice: Subject to any disclaimer, the term of this patent is extended or adjusted under 35 U.S.C. 154(b) by 0 days.

(21) Appl. No.: 09/869,058

(22) PCT Filed: Dec. 23, 1999

(86) PCT No.: PCT/IL99/00701

§ 371 (c)(1),
(2), (4) Date: Oct. 16, 2001

(87) PCT Pub. No.: WO00/38935

PCT Pub. Date: Jul. 6, 2000

(30) Foreign Application Priority Data

Dec. 24, 1998 (IL) .................................................. 127720

(51) Int. Cl.[7] .............................. B44C 1/22; B23K 26/00
(52) U.S. Cl. .......................... 438/115; 438/906; 216/65; 219/121.6
(58) Field of Search ................................. 438/115, 120, 438/597, 734, 906; 219/121.6, 121.84, 121.68; 216/65; 382/144; 15/1.51; 29/25.01

(56) References Cited

U.S. PATENT DOCUMENTS

| 4,628,531 A | 12/1986 | Okamoto et al. |
| 4,752,668 A | * 6/1988 | Rosenfield et al. .... 219/121.68 |
| 4,980,536 A | 12/1990 | Asch et al. |
| 4,987,286 A | 1/1991 | Allen |
| 5,023,424 A | 6/1991 | Vaught |
| 5,024,968 A | 6/1991 | Engelsberg |
| 5,099,557 A | 3/1992 | Engelsberg |
| 5,114,834 A | 5/1992 | Nachshon |
| 5,264,912 A | 11/1993 | Vaught et al. |
| 5,597,590 A | * 1/1997 | Tanimoto et al. ...... 219/121.61 |
| 5,634,230 A | 6/1997 | Maurer |
| 5,643,472 A | 7/1997 | Engelsberg et al. |
| 5,656,229 A | * 8/1997 | Tanimoto et al. ...... 219/121.61 |
| 5,669,979 A | * 9/1997 | Elliott et al. .................... 134/1 |
| 5,950,071 A | 9/1999 | Hammond et al. |

OTHER PUBLICATIONS

Butterbaugh, "Surface Contamination Control Using Integrated Cleaning", Semiconductor International, Jun. 1998.
DeJule, "Trends in Wafer Cleaning", Semiconductor International, Aug. 1998.
Lester, Clean Processing, Laser Post–CMP Cleans, Semiconductor International, Oct. 1998.
Lester, Clean Processing, Researchers Develop Non–Contact Technique for Cleaning Wafers, Semiconductor International, Sep. 1999.
Baliga, "Defect Detection on Patterned Wafers", Semiconductor International, May 1997, pp. 64–70.

* cited by examiner

Primary Examiner—Richard Elms
Assistant Examiner—Beth E. Owens
(74) Attorney, Agent, or Firm—Nixon & Vanderhye P.C.

(57) ABSTRACT

Particles are removed from the surface of a substrate. Respective position coordinates of the particles on the surface are determined. A beam of electromagnetic energy is directed at the coordinates of each of the particles in turn, such that absorption of the electromagnetic energy at the surface causes the particles to be dislodged from the surface substantially without damage to the surface itself.

37 Claims, 3 Drawing Sheets

METHOD AND APPARATUS FOR LOCAL VECTORIAL PARTICLE CLEANING

CROSS-REFERENCE TO RELATED APPLICATIONS

Not applicable.

FIELD OF THE INVENTION

The present invention relates generally to processing of semiconductor devices, and specifically to methods and apparatus for removal of foreign particles from semiconductor wafers and masks.

BACKGROUND OF THE INVENTION

Removal of contaminants from semiconductor wafers is a matter of great concern in integrated circuit manufacturing. As the critical dimensions of circuit features become ever smaller, the presence of even a minute foreign particle on the wafer during processing can cause a fatal defect in the circuit. Similar concerns affect other elements used in the manufacturing process, such as masks and reticles.

Various methods are known in the art for stripping and cleaning foreign matter from the surfaces of wafers and masks, while avoiding damage to the surface itself. For example, U.S. Pat. No. 4,980,536, whose disclosure is incorporated herein by reference, describes a method and apparatus for removal of particles from solid-state surfaces by laser bombardment. U.S. Pat. Nos. 5,099,557 and 5,024,968, whose disclosures are also incorporated herein by reference, describe a method and apparatus for removing surface contaminants from a substrate by high-energy irradiation. The substrate is irradiated by a laser with sufficient energy to release the particles while an inert gas flows across the wafer surface to carry away the released particles.

U.S. Pat. No. 4,987,286, whose disclosure is likewise incorporated herein by reference, describes a method and apparatus for removing minute particles (as small as submicron) from a surface to which they are adhered. An energy transfer medium, typically a fluid, is interposed between each particle to be removed and the surface. The medium is irradiated with laser energy and absorbs sufficient energy to cause explosive evaporation, thereby dislodging the particles.

One particularly bothersome type of contamination that is found on semiconductor wafers is residues of photoresist left over from a preceding photolithography step. U.S. Pat. No. 5,114,834, whose disclosure is incorporated herein by reference, describes a process and system for stripping this photoresist using a high-intensity pulsed laser. The laser beam is swept over the entire wafer surface so as to ablate the photoresist. The laser process can also be effected in a reactive atmosphere, using gases such as oxygen, ozone, oxygen compounds, nitrogen trifluoride ($NF_3$), etc., to aid in the decomposition and removal of the photoresist.

Various methods are known in the art for localizing defects on patterned wafers. A summary of these methods is present in an article entitled "Defect Detection on Patterned Wafers," in *Semiconductor International* (May, 1997), pp. 64–70, which is incorporated herein by reference. There are many patents that describe methods and apparatus for defect localization, for example, U.S. Pat. Nos. 5,264,912 and 4,628,531, whose disclosures are incorporated herein by reference. Foreign particles are one type of defects that can be detected using these methods.

U.S. Pat. No. 5,023,424, whose disclosure is incorporated herein by reference, describes a method and apparatus using laser-induced shock waves to dislodge particles from a wafer surface. A particle detector is used to locate the positions of particles on the wafer surface. A laser beam is then focused at a point above the wafer surface near the position of each of the particles, in order to produce gas-borne shock waves with peak pressure gradients sufficient to dislodge and remove the particles. It is noted that the particles must be dislodged by the shock wave, rather than vaporized due to absorption of the laser radiation. U.S. Pat. No. 5,023,424 further notes that immersion of the surface in a liquid (as in the above-mentioned U.S. Pat. No. 4,987,286, for example) is unsuitable for use in removing small numbers of microscopic particles.

SUMMARY OF THE INVENTION

It is an object of the present invention to provide methods and apparatus for efficient removal of contaminants from solid-state surfaces, and particularly for removal of microscopic particles from semiconductor wafers and other elements used in semiconductor device production. The wafers may be bare, or they may have layers formed on their surface, whether patterned or unpatterned.

It is a further object of some aspects of the present invention to provide improved methods and apparatus for targeted removal of contaminant particles from a surface based on prior localization of the particles.

It is yet a further object of some aspects of the present invention to provide apparatus and methods for removal of particles from a surface with reduced probability that a particle, once removed, will settle back onto another area of the surface.

In preferred embodiments of the present invention, a substrate whose surface is to be cleaned, such as a semiconductor wafer, is mounted on a rotating chuck. A laser beam is scanned in a radial direction, between the center of the substrate and its periphery, thus defining a narrow, radial zone of irradiation. Any point on the substrate can be positioned in the zone simply by rotating the chuck. In this manner, the laser beam can reach substantially any or every point on the substrate surface by means of a simple one-dimensional scan, in cooperation with the chuck rotation. Preferably, gases having reactive properties and/or inert gases are flowed through the zone of irradiation in order to assist in ablating contaminants and in carrying particles away from the surface. The direction and characteristics of the gas flow are arranged so that the particles are carried away via the shortest possible path, thereby reducing the probability of their settling back onto the surface. The small dimensions of the irradiated zone are significant in shortening the particle removal path, as well as in reducing the quantity of gas necessary to achieve the desired effects.

In some preferred embodiments of the present invention, a particle localization system is used to determine coordinates of the particles that must be removed from the surface. These coordinates are preferably converted to polar coordinates, for use in driving the rotation of the chuck and scanning of the laser beam. The laser beam is directed to irradiate the surface at the locations indicated by the coordinates. Absorption of the laser beam energy at the surface, whether by the particles, the substrate or a material on the substrate, imparts sufficient energy to drive the particles off the surface substantially without damage to the surface itself. Optionally, a fluid or other energy transfer medium is applied to the surface, as described, for example, in the above-mentioned U.S. Pat. No. 4,987,286, in order to promote removal of the particles by local explosive evaporation.

There is therefore provided, in accordance with a preferred embodiment of the present invention, a method for removing particles from the surface of a substrate, including:

determining respective position coordinates of the particles on the surface; and directing a beam of electromagnetic energy at the coordinates of each of the particles in turn, such that absorption of the electromagnetic energy at the surface causes the particles to be dislodged from the surface substantially without damage to the surface itself.

Preferably, determining the position coordinates includes determining polar coordinates of the particles relative to a reference feature of the substrate. Most preferably, directing the beam of electromagnetic energy includes rotating the substrate about an origin of the coordinates and scanning the beam in a radial direction with respect to the origin, responsive to the polar coordinates. Typically, determining the polar coordinates includes converting Cartesian coordinates of the particles determined by a particle detection system to the polar coordinates.

In a preferred embodiment, absorption of the electromagnetic energy causes ablation of the particles from the surface.

In another preferred embodiment, the method includes interposing an energy transfer medium between the particles to be removed and the surface, wherein absorption of the beam of electromagnetic energy causes local evaporation of the medium, thereby dislodging the particles.

In yet another, preferred embodiment, the method includes flowing a gas, preferably a gas having reactive properties, in the vicinity of the surface, which gas cooperates with the absorbed energy in removing the dislodged particles from the surface.

Preferably, directing the beam of electromagnetic energy includes directing a laser beam at the surface, and the substrate includes a semiconductor wafer.

There is further provided, in accordance with a preferred embodiment of the present invention, apparatus for detecting and removing particles from the surface of a substrate, including:

a particle localization device, adapted to determine respective position coordinates of the particles on the surface; and a particle removal device, coupled to receive the position coordinates from the particle localization device, and including an energy source which is configured to direct a beam of electromagnetic energy at the coordinates of each of the particles in turn, such that absorption of the electromagnetic energy at the surface causes the particles to be dislodged from the surface substantially without damage to the surface itself.

There is also provided, in accordance with a preferred embodiment of the present invention, apparatus for removing particles from the surface of a substrate, including:

a coordinate processor, adapted to receive input position coordinates of the particles on the surface and to determine, responsive to the input coordinates, output position coordinates for controlling the apparatus; and an energy source, which is configured to direct a beam of electromagnetic energy at each of the particles in turn, responsive to the output position coordinates, such that absorption of the energy at the surface causes the particles to be dislodged from the surface substantially without damage to the surface itself.

Preferably, the output position coordinates include polar coordinates of the particles relative to a reference feature of the substrate. Further preferably, the apparatus includes a rotating chuck, which is configured to receive the substrate and to rotate the substrate about an origin of the polar coordinates so as to position each of the particles in turn under the beam of electromagnetic energy. Most preferably, the beam is scanned in a radial direction with respect to the origin, responsive to the polar coordinates.

There is moreover provided, in accordance with a preferred embodiment of the present invention, apparatus for removing contaminants from the surface of a substrate, including:

a rotating chuck, which is configured to receive the substrate and to rotate the substrate about an axis of the chuck; and an energy source which is configured to direct a beam of electromagnetic energy over the surface of the substrate, causing the contaminants to be dislodged from the surface, and to scan the beam in a radial direction with respect to the axis, in cooperation with the rotation of the chuck, so as to impinge upon substantially any point on the surface from which the contaminants are to be removed.

Preferably, the apparatus includes a chamber, which is configured to receive the substrate and to form an encapsulated region over a portion of the surface at which the beam of energy is directed. Further preferably, the chamber includes a window, forming one side of the encapsulated region, through which window the beam of energy passes to impinge upon the surface. Most preferably, the encapsulated region contains only a portion of the surface of the substrate.

Preferably, the chamber includes one or more gas ports communicating with the encapsulated region so as to flow a gas therethrough, wherein the gas cooperates with the absorbed energy in removing the dislodged particles from the surface. Further preferably, the one or more gas ports include an inlet port for feeding a gas having reactive properties into the encapsulated region and an outlet port for removing exhaust gas from the encapsulated region. Alternatively or additionally, the one or more gas ports include inlet and outlet ports through which an inert gas is introduced into the chamber so as to generate a laminar flow of the gas over the surface of the substrate. Preferably, the gas flow through the encapsulated region carries away the contaminants dislodged from the surface, and wherein the gas ports are configured so that the gas flows in such a direction as to generally minimize a distance over which the contaminants must be carried before being removed from a vicinity of the surface.

There is additionally provided, in accordance with a preferred embodiment of the present invention, a method for removing contaminants from the surface of a substrate, including:

rotating the substrate about an axis thereof;

directing a beam of electromagnetic energy over the surface of the substrate, causing the contaminants to be dislodged from the surface; and scanning the beam in a radial direction with respect to the axis, in cooperation with rotating the substrate, so that the beam impinges upon substantially any point on the surface from which the contaminants are to be removed.

The present invention will be more fully understood from the following detailed description of the preferred embodiments thereof, taken together with the drawings in which:

DETAILED DESCRIPTION OF PREFERRED EMBODIMENTS

Figure 1:
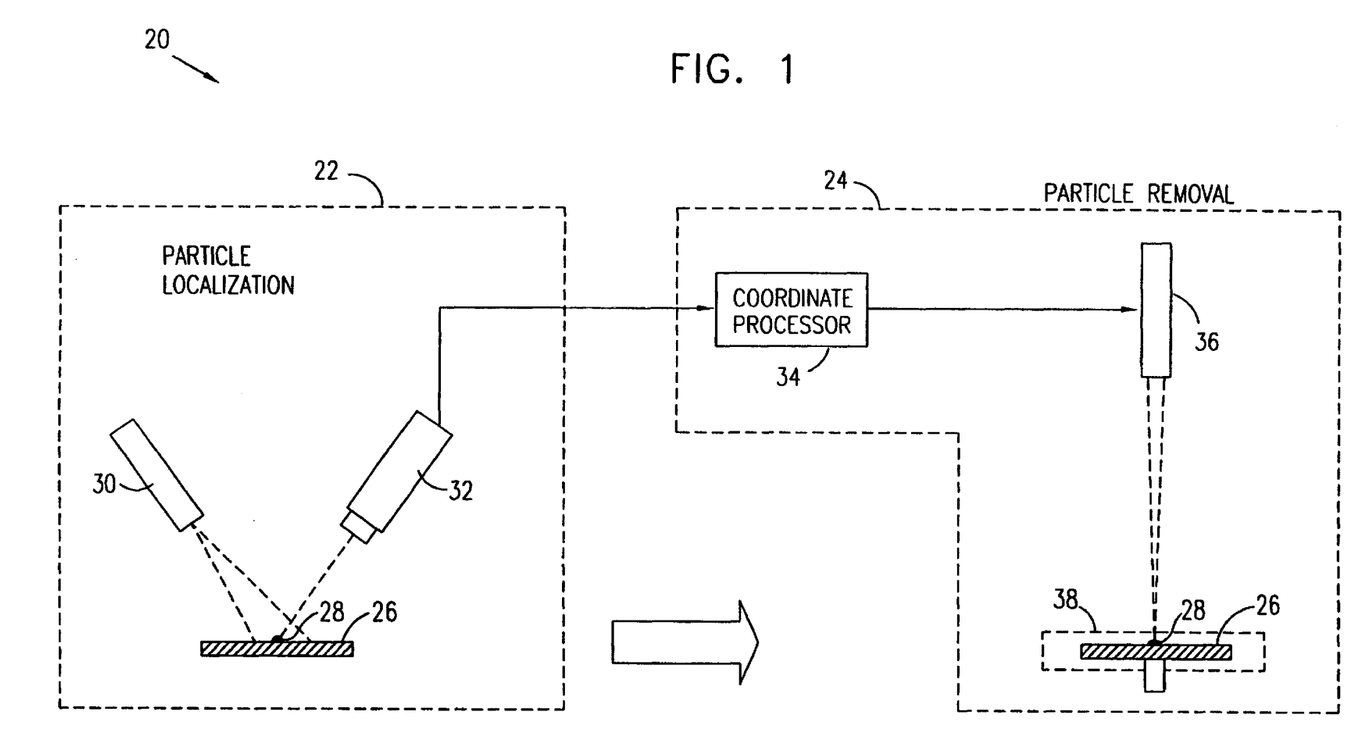
FIG. 1 is a schematic illustration of a system for removal of particles from the surface of a semiconductor wafer, in accordance with a preferred embodiment of the present invention.

FIG. 1 is a schematic view of a system 20 for location and removal of contaminants from a surface of a semiconductor wafer 26, in accordance with a preferred embodiment of the present invention. System 20 comprises two sub-systems: a particle localization device 22 and a particle removal device 24. Typically, devices 22 and 24 are separate entities, as shown in the figure. Localization device 22 determines the coordinates of contaminant particles 28 on the surface of the wafer. The coordinates are passed to a coordinate processor 34, which stores the coordinates and transforms them to a coordinate frame of particle removal device 24. The wafer is then transferred to the particle removal device, where the coordinates are used to direct the removal of the particles from the surface. Alternatively, devices 22 and 24 are constructed as a single, integral unit, which both determines the particle coordinates and removes the particles accordingly, without the need to transfer the wafer from one entity to the next.

Particle localization device 22 may comprise any suitable automated inspection system known in the art, such as the defect detection systems mentioned in the Background of the Invention. For example, the KLA-Tencor "Surfscan" system may be used for this purpose. Typically, a laser 30 irradiates the surface of wafer 26, and a detector 32 senses irregularities in the radiation reflected from the surface. The irregularities are analyzed to determine the coordinates of particles 28, and possibly of other surface defects, as well. Inspection systems known in the art generally determine Cartesian coordinates of such particles and other defects. Preferably, device 22 is capable of distinguishing between irregularities due to particles and due to other causes. Alternatively, device 24 may attempt (without success) to remove particles from locations of defects that are not removable particles. Aside from reducing the throughput of system 20, it is not likely that any harm will result to wafer 26 due to the processing of these non-particle defects by device 24.

Particle removal device 24 comprises a laser 36, which directs an intense beam of energy at the surface of wafer 26. In some preferred embodiments of the present invention, the laser comprises an excimer laser, such as a Lambda Physik LPX315 IMC laser, which emits ultraviolet radiation. Alternatively, other laser types and wavelengths, such as infrared or visible lasers, may be used. The wafer is contained in a chamber 38, which is described in detail hereinbelow. The laser energy is absorbed at the wafer surface, causing particles 28 to be dislodged from the surface substantially without damage to the surface itself. Typically, absorption of the laser energy, by the particles and/or by the wafer, causes the particles to be ablated or otherwise dislodged from the surface, as described, for example, in the above-mentioned U.S. Pat. No. 5,114,834 or in PCT patent application PCT/IL96/00141, which is also incorporated herein by reference. Additionally or alternatively, as described in the above-mentioned U.S. Pat. No. 4,987,286, an energy transfer medium is applied to the surface. The laser energy, absorbed by the medium and/or by the wafer, causes explosive evaporation, thereby dislodging the particles. Further alternatively, device 24 may use any other suitable method of localized particle removal that is known in the art. Optionally, the wafer in the chamber is pre-heated, typically to a temperature of about 150–250° C., in order to facilitate removal of the particles when irradiated by the laser beam.

As another option, device 24 may comprise means for visual inspection of the wafer surface, such as a video camera with suitable optics and a video monitor (not shown in the figures). An operator of system 20 can observe the video monitor to inspect the locations of particles 28, both before and after particle removal.

Figure 2:
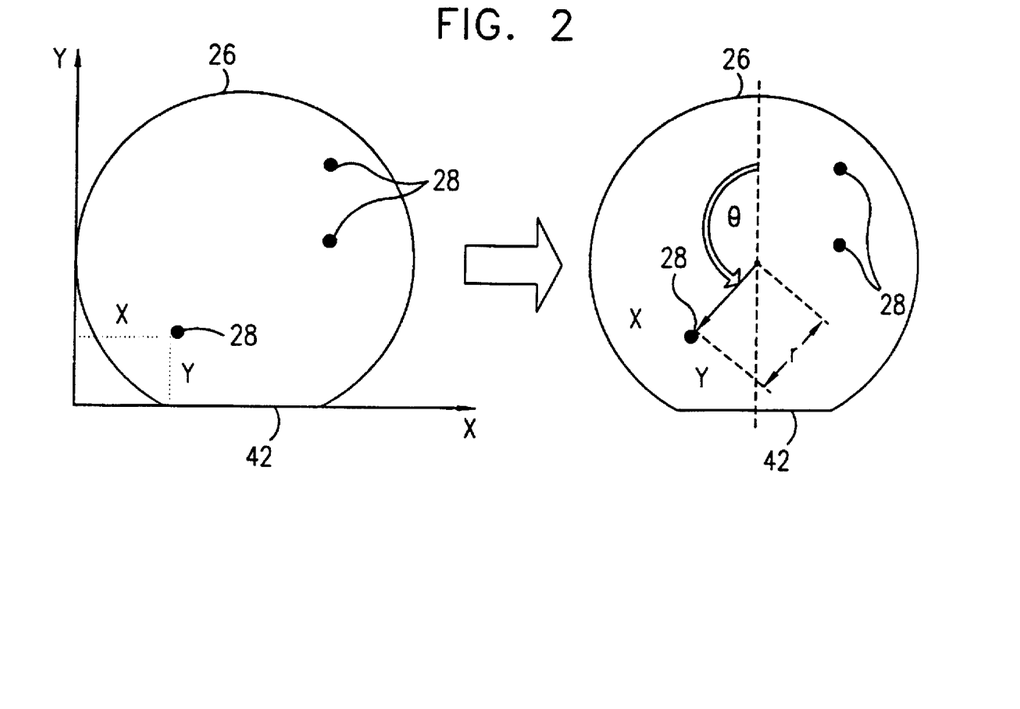
FIG. 2 is a schematic top view of a semiconductor wafer, illustrating a coordinate transformation applied with regard to particles on the wafer surface, in accordance with a preferred embodiment of the present invention.

FIG. 2 is a schematic top view of wafer 26, illustrating a coordinate transformation applied by coordinate processor 34, in accordance with a preferred embodiment of the present invention. As noted above, particle localization device 22 typically provides Cartesian coordinates of defects 28, as shown on the left side of the figure. The coordinate axes are referred to a reference mark on the wafer, such as a flat 42 on one side of the wafer. For each particle 28, processor 34 determines a radial coordinate r, corresponding to a radial distance of the particle location from a center point of the wafer, and an angular coordinate θ, relative to a reference axis determined by flat 42, as shown on the right side of the figure. The polar coordinates are used advantageously to drive movement of wafer 26 in chamber 38 and scanning of the beam of laser 36, as described hereinbelow.

Figure 3:
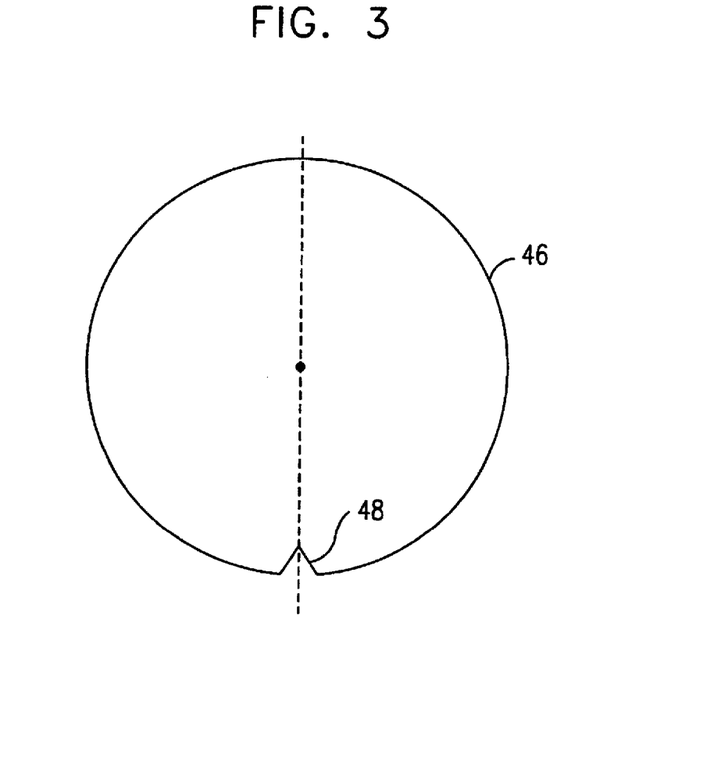
FIG. 3 is a schematic top view of another type of semiconductor wafer, to which the coordinate transformation of FIG. 2 may be applied.

FIG. 3 is a schematic top view of another wafer 46 having a notch 48, as is common in new-generation 300 mm wafers, in place of flat 42. The reference axis for determination of the angular coordinate θ of the defects is thus located relative to the notch. In other respects, however, wafer 46 may be used interchangeably with wafer 26 in the preferred embodiments described herein.

Figure 4:
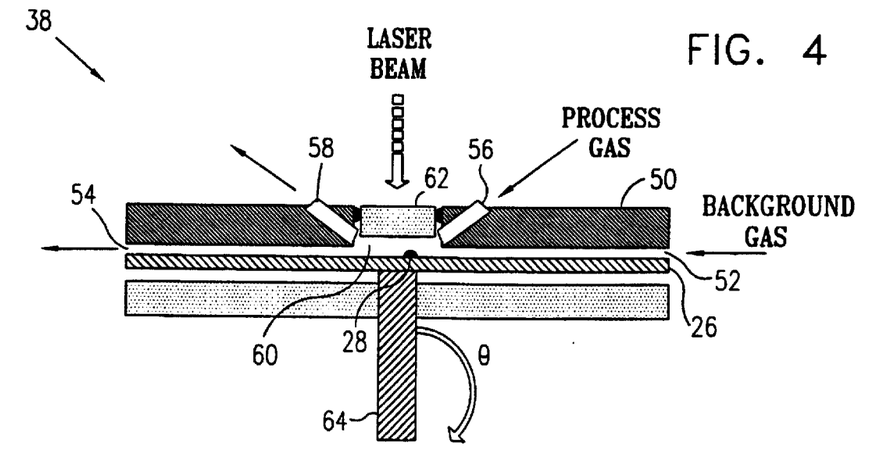
FIG. 4 is a schematic, sectional illustration of a semiconductor wafer in a particle removal process chamber, in accordance with a preferred embodiment of the present invention.
Figure 5:
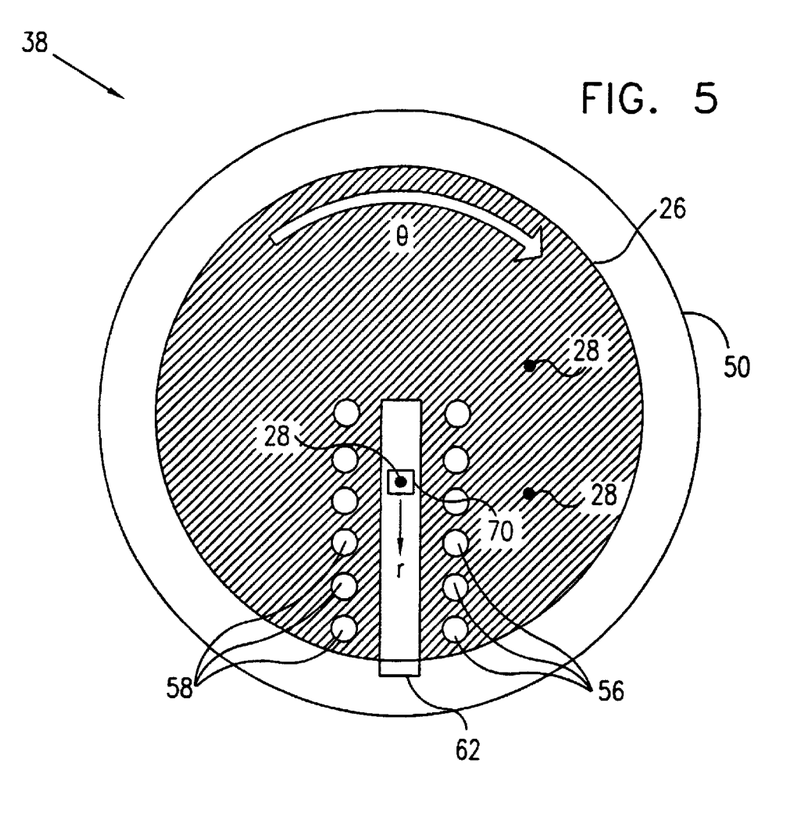
FIG. 5 is a schematic top view of the wafer and process chamber shown in FIG. 4.

Reference is now made to FIGS. 4 and 5, which schematically illustrate details of chamber 38, in accordance with a preferred embodiment of the present invention. FIG. 4 is a sectional side view, and FIG. 5 is a top view. Chamber 38 comprises a rotating chuck 64, on which wafer 26 rests securely (typically by vacuum suction, as is known in the art), and an upper cover 50 over the surface that is to be cleaned. The laser beam irradiates the wafer surface through a window 62, preferably a quartz window of sufficient transparency at the laser wavelength. The window is preferably long and narrow, covering a full radius of wafer 26. To remove any one of particles 28, chuck 64 is rotated to an appropriate angle θ so that the particle is located under window 62, and the laser beam is scanned radially so that the particle is contained within a footprint 70 of the beam. When the laser is fired, the particle is ablated from the surface. If necessary, multiple laser pulses are applied at all or some of the particle locations, as may be required for complete particle removal.

The radial scanning of the laser beam can be accomplished either by angular deflection of the beam, using any sort of suitable optical scanner, or by translating an optical beam-handling assembly (or even the entire laser) over the wafer in a radial direction. These and other suitable methods of scanning will be apparent to those skilled in the art. In any case, no translational movement of wafer 26 is required for the laser beam to reach substantially any point on the wafer surface. The elimination of wafer translation allows chamber 38 to be made substantially smaller than chambers used in laser particle removal systems known in the art, which must have dimensions of at least twice the wafer diameter in order to accommodate full X-Y translation. Chamber 38, by contrast, must accommodate only wafer rotation.

Although system 20 is designed for the purpose of local particle removal, based on known particle coordinates, particle removal device 24 may also be used advantageously to scan and remove contaminants, such as photoresist residues, from the entire surface of wafer 26. In this case, the wafer is rotated in steps through the entire 360° of rotation of chuck 64, while at each step, laser footprint 70 is scanned over the entire radius of the wafer. Alternatively, a selected sector of the wafer may be cleaned in this manner.

Cover 50 and window 62 of chamber 38 define an encapsulated region 60 underneath the window. This is the region in which the laser beam acts on particles 28. Preferably, a process gas is fed into region 60 through a plurality of gas inlet ports 56. Most preferably, the process gas comprises a gas or a combination of gases having reactive properties, such as ozone, a nitrogen oxide ($N_xO_y$), $NF_3$, or other oxygen- or fluorine-containing gases. Ultraviolet laser radiation in region 60 causes these gases to release reactive oxygen and fluorine radicals, which aid in the decomposition of the particles and cleaning of the wafer surface. Because region 60 covers only a small part of the wafer surface, only a relatively small quantity of the process gas is needed to fill the region to a required partial pressure of the gas. This reduction in process gas consumption, relative to reactive contaminant removal methods known in the art, results in cost savings and alleviates environmental concerns due to release of poisonous reactive gases from the chamber.

Alternatively, a vapor may be introduced through the ports, which condenses to form a liquid film on the surface. In this case, laser irradiation causes explosive local evaporation of the liquid, driving the particles off the wafer surface.

The gas from region 60 is preferably exhausted through gas exhaust ports 58. As these ports are immediately adjacent to region 60, the particles removed from the wafer surface will generally be swept immediately out of the region and away from the wafer surface. By minimizing the distance that released particles must travel over the wafer surface, system 20 thus reduces the likelihood that a released particle will settle back down on another part of the wafer surface. Rapid and efficient removal of the released particles is very important, because when released particles do settle back down on the wafer, they may be even harder to remove than they were initially.

Additionally or alternatively to the flow of a process gas through ports 56 and 58, a background gas, generally an inert gas or gas mixture, may be made to flow over the wafer surface. The background gas is preferably injected through one or more inlet ports 52 and flows over wafer 26 in a laminar layer, exiting through one or more outlet ports 54. This laminar gas flow effectively seals off the wafer surface to further contamination and eliminates the possibility of particles escaping from region 60 and settling on other areas of the wafer. The position of ports 52 and 54 in FIG. 4 is such that the background gas will flow across the wafer surface in a direction perpendicular to the long axis of region 60. Alternatively, the ports may be positioned so that the gas will flow parallel to this axis, or in any other suitable direction across the wafer.

Although preferred embodiments are described herein with reference to removal of particles from semiconductor wafers, the principles of the present invention may similarly be applied to removing contaminants from other sorts of substrates, as well. For example, the apparatus and methods described herein are especially suited for cleaning photolithography masks, reticles and other elements used in semiconductor device processing. Furthermore, although in the preferred embodiments described above, a laser beam is used to remove the particles from the wafer surface, other types of electromagnetic energy beams may also be used for this purpose.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for removing particles from a surface of a substrate, comprising:
    determining respective position coordinates of the particles on the surface; and
    directing a beam of electromagnetic energy at the position coordinates of each of the particles in turn, such that absorption of the electromagnetic energy at the surface causes the particles to be dislodged from the surface substantially without damage to the surface itself.

2. The method according to claim 1, wherein determining the position coordinates comprises determining polar coordinates of the particles relative to a reference feature of the substrate.

3. The method according to claim 2, wherein directing the beam of electromagnetic energy comprises rotating the substrate about an origin of the position coordinates and scanning the beam in a radial direction with respect to the origin, responsive to the polar coordinates.

4. The method according to claim 2, wherein determining the polar coordinates comprises converting Cartesian coordinates of the particles determined by a particle detection system to the polar coordinates.

5. The method according to claim 1, wherein absorption of the electromagnetic energy causes ablation of the particles from the surface.

6. The method according to claim 1, further comprising interposing an energy transfer medium between the particles to be removed and the surface, wherein absorption of the beam of electromagnetic energy causes local evaporation of the medium, thereby dislodging the particles.

7. The method according to claim 1, further comprising flowing a gas in a vicinity of the surface, whereby the gas cooperates with the absorbed energy in removing the dislodged particles from the surface.

8. The method according to claim 7, wherein the gas has reactive properties.

9. The method according to claim 1, wherein directing the beam of electromagnetic energy comprises directing a laser beam at the surface.

10. The method according to claim 1, wherein the substrate comprises a semiconductor wafer.

11. An apparatus for detecting and removing particles from a surface of a substrate, comprising:
a particle localization device, adapted to determine respective position coordinates of the particles on the surface; and
a particle removal device, coupled to receive the position coordinates from the particle localization device, and comprising an energy source which is configured to direct a beam of electromagnetic energy at the position coordinates of each of the particles in turn, such that absorption of the electromagnetic energy at the surface causes the particles to be dislodged from the surface substantially without damage to the surface itself.

12. The apparatus according to claim 11, wherein absorption of the electromagnetic energy causes ablation of the particles from the surface.

13. The apparatus according to claim 11, wherein an energy transfer medium is applied to the surface of the substrate in the particle removal device, and wherein absorption of the beam of electromagnetic energy at the surface causes local evaporation of the medium, thereby dislodging the particles.

14. The apparatus according to claim 11, wherein the particle removal device comprises a coordinate processor, which is adapted to determine polar coordinates of the particles relative to a reference feature of the substrate, and wherein the particle removal device further comprises a rotating chuck, on which the substrate is mounted, which rotates the substrate responsive to the polar coordinates so as to position the particles under the beam of electromagnetic energy.

15. An apparatus for removing particles from a surface of a substrate, comprising:
a coordinate processor, adapted to receive input position coordinates of the particles on the surface and to determine, responsive to the input coordinates, output position coordinates for controlling the apparatus; and
an energy source, which is configured to direct a beam of electromagnetic energy at each of the particles in turn, responsive to the output position coordinates, such that absorption of the energy at the surface causes the particles to be dislodged from the surface substantially without damage to the surface itself.

16. The apparatus according to claim 15, wherein the output position coordinates comprise polar coordinates of the particles relative to a reference feature of the substrate.

17. The apparatus according to claim 16, further comprising a rotating chuck which is configured to receive the substrate and to rotate the substrate about an origin of the polar coordinates so as to position each of the particles in turn under the beam of electromagnetic energy.

18. The apparatus according to claim 17, wherein the beam of electromagnetic energy is scanned in a radial direction with respect to the origin, responsive to the polar coordinates.

19. The apparatus according to claim 15, further comprising a chamber which is configured to receive the substrate and to form an encapsulated region over a portion of the surface at which the beam of electromagnetic energy is directed.

20. The apparatus according to claim 19, wherein the chamber comprises one or more gas ports communicating with the encapsulated region so as to flow a gas therethrough, wherein the gas cooperates with the absorbed energy in removing the dislodged particles from the surface.

21. The apparatus according to claim 15, wherein the energy source comprises a laser.

22. The apparatus according to claim 15, wherein the substrate comprises a semiconductor wafer.

23. An apparatus for removing contaminants from a surface of a substrate, comprising:
a rotating chuck, which is configured to receive the substrate and to rotate the substrate about an axis of the chuck; and
an energy source which is configured to direct a beam of electromagnetic energy over the surface of the substrate, causing the contaminants to be dislodged from the surface, and to scan the beam in a radial direction with respect to the axis, in cooperation with the rotation of the chuck, so as to impinge upon substantially any point on the surface from which the contaminants are to be removed.

24. The apparatus according to claim 23, further comprising a chamber, which is configured to receive the substrate and to form an encapsulated region over a portion of the surface at which the beam of electromagnetic energy is directed.

25. The apparatus according to claim 24, wherein the chamber comprises a window, forming one side of the encapsulated region, through which window the beam of electromagnetic energy passes to impinge upon the surface.

26. The apparatus according to claim 24, wherein the encapsulated region contains only a portion of the surface of the substrate.

27. The apparatus according to claim 24, wherein the chamber comprises one or more gas ports communicating with the encapsulated region so as to flow a gas therethrough, wherein the gas cooperates with the absorbed energy in removing the dislodged particles from the surface.

28. The apparatus according to claim 27, wherein the one or more gas ports comprise an inlet port for feeding a gas having reactive properties into the encapsulated region and an outlet port for removing exhaust gas from the encapsulated region.

29. The apparatus according to claim 27, wherein the one or more gas ports comprise inlet and outlet ports through which an inert gas is introduced into the chamber so as to generate a laminar flow of the gas over the surface of the substrate.

30. The apparatus according to claim 27, wherein the gas flow through the encapsulated region carries away the contaminants dislodged from the surface, and further wherein the gas ports are configured so that the gas flows in such a direction as to generally minimize a distance over which the contaminants must be carried before being removed from a vicinity of the surface.

31. The apparatus according to claim 23, wherein the energy source comprises a laser.

32. The apparatus according to claim 23, wherein the substrate comprises a semiconductor wafer.

33. A method for removing contaminants from a surface of a substrate, comprising:
rotating the substrate about an axis thereof;
directing a beam of electromagnetic energy over the surface of the substrate, causing the contaminants to be dislodged from the surface; and
scanning the beam in a radial direction with respect to the axis, in cooperation with rotating the substrate, so that the beam impinges upon substantially any point on the surface from which the contaminants are to be removed.

34. The method according to claim 33, further comprising forming an encapsulated region over a portion of the surface at which the beam of electromagnetic energy is directed, wherein the encapsulated region contains only a portion of the surface of the substrate.

35. The method according to claim 34, further comprising flowing a gas through the encapsulated region, wherein the gas cooperates with the absorbed energy in removing the dislodged particles from the surface.

36. The method according to claim 35, wherein the gas flowing through the encapsulated region carries away the contaminants dislodged from the surface, and further wherein flowing the gas comprises causing gas to flow in such a direction as to generally minimize a distance over which the contaminants must be carried before being removed from a vicinity of the surface.

37. The method according to claim 33, further comprising interposing an energy transfer medium between the contaminants and the surface, wherein directing the beam of electromagnetic energy causes local evaporation of the medium, thereby dislodging the contaminants.

* * * * *

UNITED STATES PATENT AND TRADEMARK OFFICE
CERTIFICATE OF CORRECTION

| | |
|---|---|
| PATENT NO. | : 6,566,169 B1 |
| DATED | : May 20, 2003 |
| INVENTOR(S) | : Uziel et al. |

Page 1 of 1

It is certified that error appears in the above-identified patent and that said Letters Patent is hereby corrected as shown below:

<u>Title page,</u>
Item [75], Inventors, change the spelling of "Le Fris Man" to -- Le Frisman --.

Signed and Sealed this

Tenth Day of May, 2005

JON W. DUDAS
*Director of the United States Patent and Trademark Office*